United States Patent [19]

Kusatani et al.

[11] Patent Number: 4,901,016

[45] Date of Patent: Feb. 13, 1990

[54] DEVICE HAVING A MAGNETIC HEAD FOR MEASURING MAGNETIZATION CHARACTERISTICS OF A MAGNETIC THIN FILM

[75] Inventors: Sadatoshi Kusatani; Toru Nakashima, both of Himeji, Japan

[73] Assignee: Glory Kogyo Kabushiki Kaisha, Hyogo, Japan

[21] Appl. No.: 174,448

[22] Filed: Mar. 25, 1988

[30] Foreign Application Priority Data

Mar. 25, 1987 [JP] Japan .................................. 62-70668

[51] Int. Cl.$^4$ ..................... G01R 33/12; G01N 27/72; G11B 27/36; G11B 5/17
[52] U.S. Cl. .................................. 324/210; 324/239; 360/31; 360/123
[58] Field of Search ............................... 324/210–212, 324/239, 241–243; 360/31, 123, 131

[56] References Cited

U.S. PATENT DOCUMENTS 3,588,681  6/1971  Murray .............................. 324/212

Primary Examiner—Reinhard J. Eisenzopf
Assistant Examiner—Walter E. Snow
Attorney, Agent, or Firm—Wenderoth, Lind & Ponack

[57] ABSTRACT

A magnetization characteristic measurement device includes a differential magnetic head, a signal generator for exciting the differential magnetic head with a low frequency signal, a magnetic head moving device for moving the differential magnetic head to a predetermined measuring position, a measured data converting device for sampling the differential output voltages from the magnetic head when it is positioned at the predetermined position and for converting the sampled values into digital values, and a measured data analyzing device for sequentially storing the obtained digital values and for calculating the magnetizing characteristics. The structure allows for simple and easy measurement of magnetization characteristics of magnetic thin films attached to a magnetic printing, magnetic tape, etc. by simply setting the magnetic thin film at a position. The result of the measurement is displayed on a display screen or indicated using a buzzing sound to thereby reduce inspection steps. Since the quality is displayed in reference to a predetermined standard, standardization of quality can be easily achieved.

17 Claims, 12 Drawing Sheets

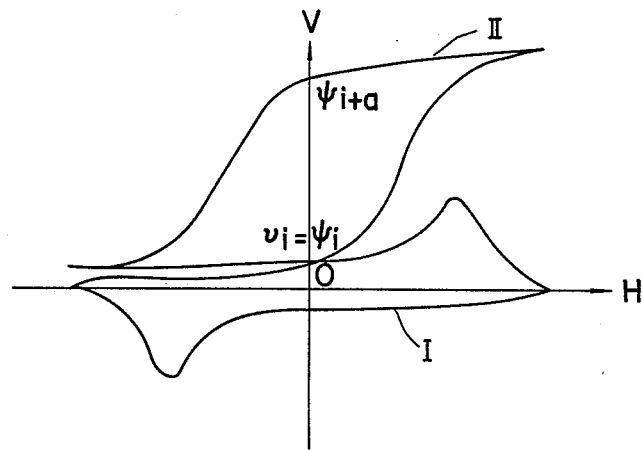
F I G. 6
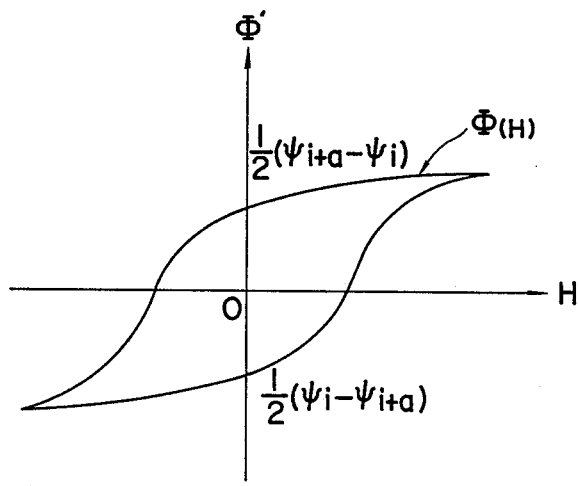
F I G. 7

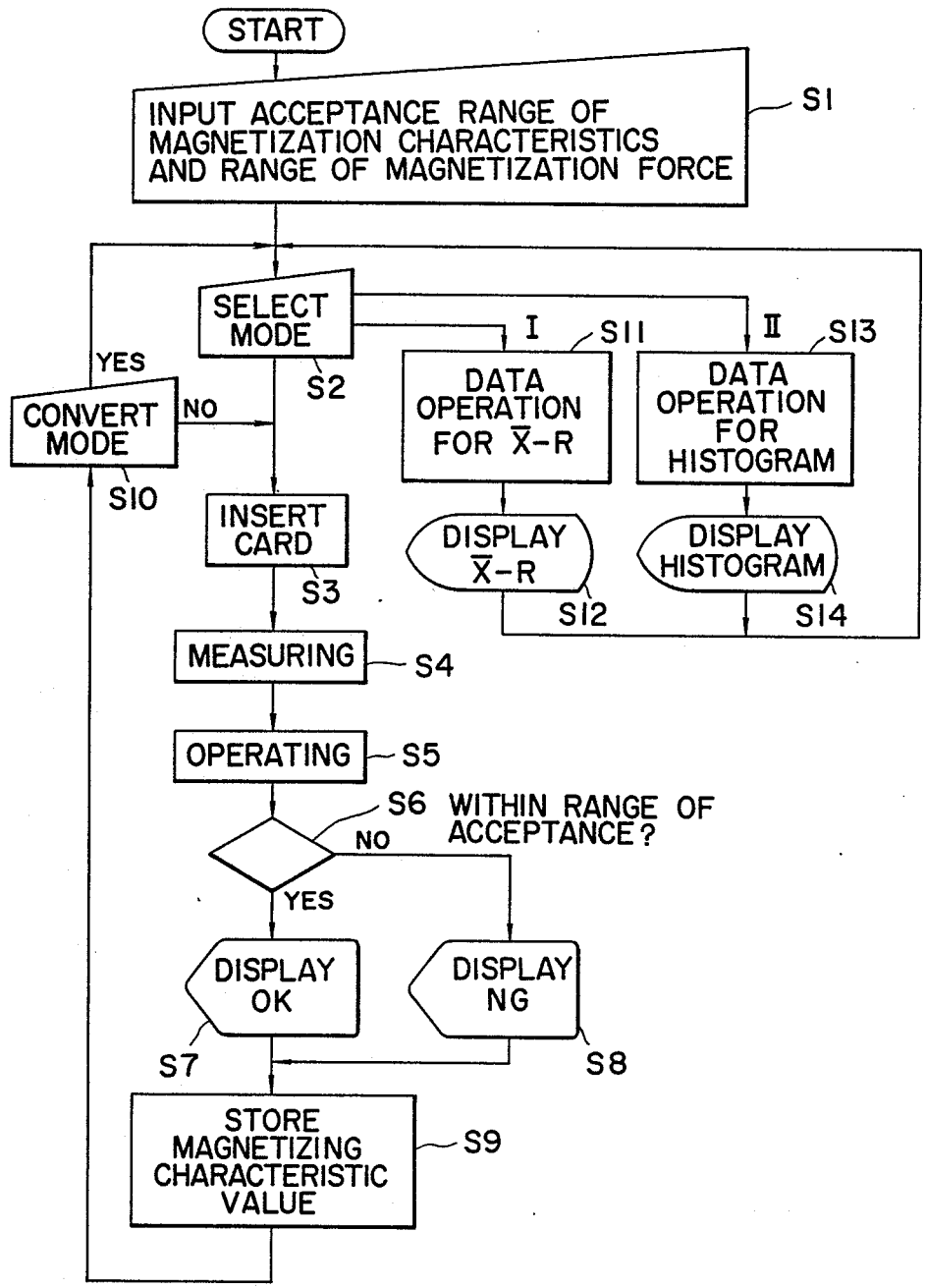
F I G. 10

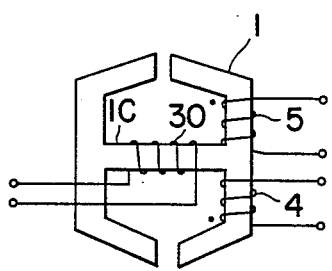
F I G. 14
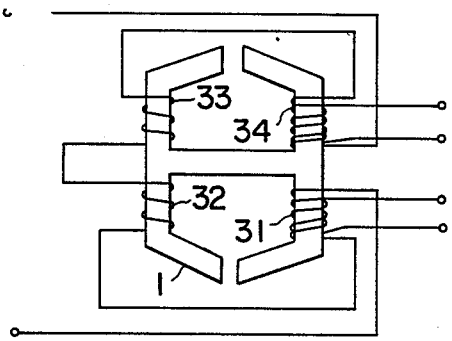
F I G. 15

DEVICE HAVING A MAGNETIC HEAD FOR MEASURING MAGNETIZATION CHARACTERISTICS OF A MAGNETIC THIN FILM

BACKGROUND OF THE INVENTION

This invention relates to a device for measuring magnetization characteristics of a magnetic thin film attached to magnetic tapes, magnetic stripes on magnetic cards, magnetic discs or the like.

Along with the progress in the information society, magnetic recording media such as magnetic cards, magnetic tapes or magnetic discs have formed a considerably large market which is expected to further expand in the future. In order to stably manufacture these media in a large quantity at a low cost and improve product quality, further research and developing efforts are required. A measurement device for measuring magnetization characteristics of these media is one of the supporting means for such efforts. For example, a DC magnetization characteristic automatic recording system (Model 3257, Yokogawa Electric Corporation in Japan) and DC magnetized B-H characteristics automatic recording systems (Model BHS-40, BHH-50 and BHU-60, Riken Denshin Kabushiki Kaisha in Japan) are currently commercial available for recording the magnetization characteristics of magnetic films, such as the magnetic film on a magnetic tape.

As an example of detection by those systems, a detection method popularly used for magnetization characteristics on an annular sample will be described. When a magnetic material or an object of detection is charged with a magnetic field H, the density of the magnetic flux $\Phi$ generated on the material changes according to the intensity of the magnetic field H. When the magnetic field H is plotted on a horizontal axis, and the magnetic flux $\Phi$ on a vertical axis, a magnetization curve or a hysteresis loop is obtained. More specifically, as shown in FIG. 1, an anuular magnetic material 100 is wound with a magnetizing coil 101 (the number of windings designated $N_1$) on the primary side thereof and with a detection coil 102 (the number of windings designated $N_2$) on the secondary side thereof. The magnetization coil 101 is supplied with sine wave signal of a low frequency from a low frequency oscillator 103, and a resistance $R_1$ is inserted in series as shown.

Since the magnetic field H in the magnetic material 100 can be regarded as proportional to the electric current $I_1$ passing through the magnetizing coil 101, if the length of the magnetic path of the magnetic material 100 is denoted as l, the following relation holds:

$$H = \frac{N_1 I_1}{l} = \frac{N_1}{l R_1} \cdot V_1 \quad (1)$$

The generated magnetic flux $\Phi$ is obtained by integrating the output voltage $V_2$ of the detection coil 102. Namely, since the output voltage $V_c$ can be determined by equation (2) below.

$$V_c = \frac{1}{C \cdot R_2} \int V_2 dt = \frac{-N_2}{C \cdot R_2} \int \frac{d\Phi}{dt} = \frac{-N_2}{C \cdot R_2} \cdot \Phi \quad (2)$$

The following relation therefore holds as shown below as equation (3).

$$\Phi = \frac{-C \cdot R_2}{N_2} \cdot V_c \quad (3)$$

A magnetization curve ($\Phi - H$ curve) can be obtained by measuring the voltages $V_1$ and $V_c$. If the voltage $V_2$ is plotted on the vertical axis, the output proportional to magnetic permeability is obtained.

The magnetic material measurement system based on the above described principle is disclosed in "Yokogawa Giho" Vol.17, No. 2, pp. 49–72, 1973. Although the measurement system is intended for universal use, as it is applicable to the measurement of having a materials of high permeability such as plates or blocks of permanent magnets, magnetic powder, magnetic thin film, etc., the measurement system is still not entirely free of problems in performance, operability and price. Moreover, when used for measuring magnetic stripes prepared by thermal transfer or application on a paper card, a card or a passbook on which magnetic tapes are pasted, or a magnetic card coated on its surface in magnetization characteristics, a sample 110 of the magnetic thin films should be cut out from the card or book as shown in FIG. 2, adjusted in size to accommodate the size of the system, and sorted in a layer of about ten cards before being subjected to the actual measurement. The system therefore is extremely cumbersome. The measurement system, moreover, is incapable of measuring the magnetization characteristics of magnetic stripes on a magnetic card as incorporated on the card. It was heretofore extremely difficult to measure the absolute value of the magnetization characteristics of a magnetic stripe medium, a magnetic disc medium or the like.

Moreover, users have to visually read, calculate and judge the magnetization characteristics such as saturated flux, residual magnetism and coercive force from a hysteresis curve drawn as a hard copy by an X-Y recorder mounted on the system in order to determine the acceptance of the magnetization characteristics. The work therefore was considerably combersome. No measuring device has so far achieved an effective analysis of process capability of the magnetization characteristics. The currently available systems are inconveniently bulky in size as a whole since discrete components such as an exciter/amplifier, a signal processing integrator, an X-Y recorder, etc. are merely combined.

SUMMARY OF THE INVENTION

This invention was contrived to eliminate such problems encountered in the prior art. The first object of this invention is to provide a device which can measure the magnetization characteristics of a magnetic thin film such as a magnetic tape, magnetic stripe or magnetic disc without cutting out a portion of the sample magnetic tape or otherwise physically destroying the samples.

The second object of this invention is to provide a device which can automatically determine the acceptance/rejection of the magnetization characteristics of the magnetic thin film mentioned above.

According to one aspect of this invention, for achieving the objects described above, there is provided a device for measuring magnetization characteristics of a magnetic thin film comprising a differential magnetic head, a low frequency triangle wave signal generation which excites the differential magnetic head with a low frequency triangle wave signal, a magnetic head moving means which moves the differential magnetic head to a position above or near the magnetic thin film which is to be measured, a measured data converting means which samples differential output voltages from the magnetic head when the magnetic head is positioned above or near the object magnetic thin film and which converts the sampled values into digital values, and a measured data analyzing means which sequentially stores the digital values converted by the converting means and calculates magnetizing characteristics of the magnetic thin film.

According to another aspect of this invention, there is provided a device for measuring magnetization characteristics of a magnetic thin film comprising a differential magnetic head, a low frequency triangle wave signal generator which excites the differential magnetic head with a low frequency triangle wave signal, a magnetic head moving means which moves the differential magnetic head to a position above or near a magnetic thin film which is to be measured, a setting means which sets in advance a maximum value and a minimum value of the magnetization characteristics which are acceptable for the magnetic thin film, a measured data converting means which samples differential output voltages from the differential magnetic head when the head is positioned either above or near the magnetic thin film or the object of the measurement, and which converts the sampled values into digital values, and measured data analyzing means which sequentially stores the digital values converted by the measured data converting means, calculates the magnetization characteristics of the magnetic thin film, and compares the result of calculation with a predetermined reference value set in advance by the setting means to thereby determine the acceptance/rejection of the magnetic thin film.

The nature, principle and utility of the invention will become more apparent from the following detailed description when read in conjunction with the accompanying drawings.

BRIEF DESCRIPTION OF THE DRAWINGS

In the accompanying drawings:

FIGS. 6 and 7 are graphs of characteristics of magnetic fields, respectively;

FIG. 10 is a flow chart of an example of operation of the magnetization characteristic measuring device;

FIGS. 14 through 18 are views of other structures of the magnetic head, respectively.

DETAILED DESCRIPTION OF THE INVENTION

Figure 3:
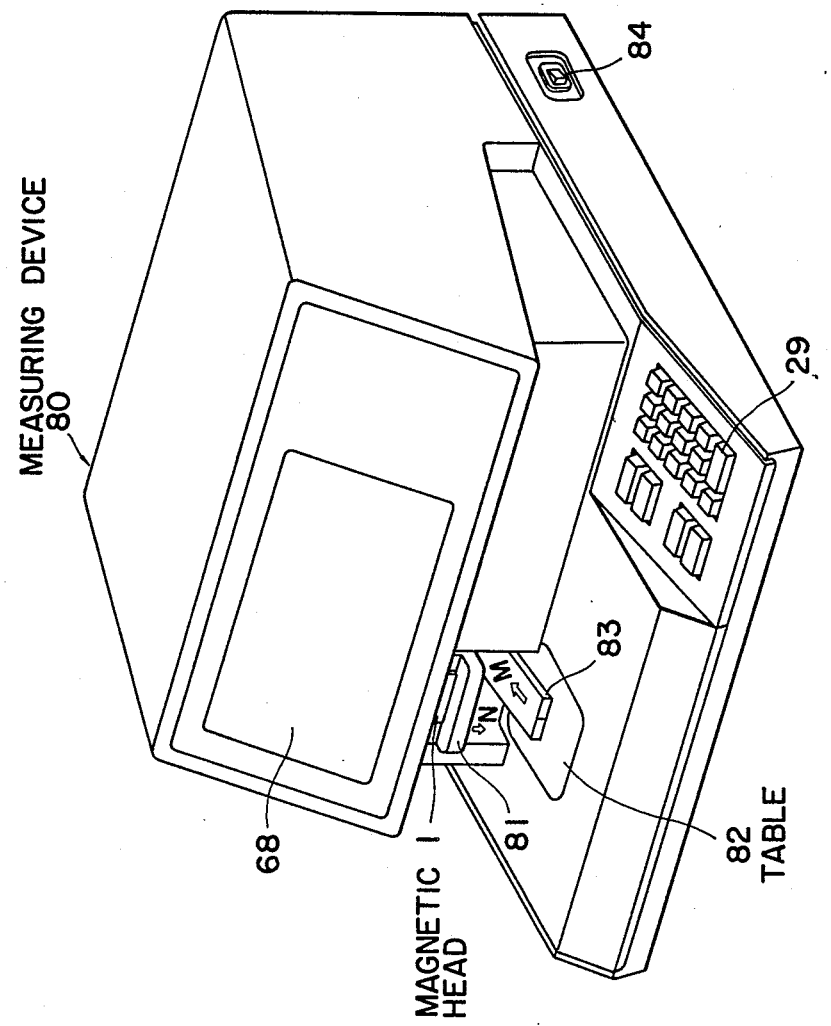
FIG. 3 is a perspective view of an embodiment of the magnetization characteristic measuring device according to this invention.

FIG. 3 is a perspective view of the appearance of an embodiment of this invention device 80 for measuring magnetization characteristics. In the magnetization characteristic measuring device 80 (hereinafter referred to simply as a measuring device), there is provided at the left side of a front panel a table 82 onto which a magnetic card with laminated magnetic thin film is inserted and supported. A marker 83 for positioning the measuring portion on the magnetic thin film or the object of measurement which is laminated on a card is provided in a freely advancing/receding fashion above the table 82. Also provide above the marker 83 are an arm 81 which can be raised/lowered to secure the card, etc. mounted on the table 82 and a magnetic head 1 which reads out the magnetic characteristics. At the time when the positioning of a magnetic card is completed, the arm 81 is controlled by a manipulation button to be lowered in the direction of the arrow N to secure the card, etc. The position of the object to be measured is re-confirmed by the marker 83 which is controlled by the manipulation button to recede in the direction of the arrow M, the magnetic head 1 is moved to a predetermined position in alignment with the vertical lines of the market 83 or the object to be measured, and the magnetization characteristics of the magnetic thin films are measured. At the right side of the panel is provided a keyboard 29 having ten-keys for inputting the necessary operation sequence of data. Above the panel in the left portion is provided a display 68, such as liquid crystal type, for displaying measured items of the magnetization characteristics of the magnetic thin film. A power switch 84 is provided on the right side of the panel of the measuring device 80.

Figure 4A:
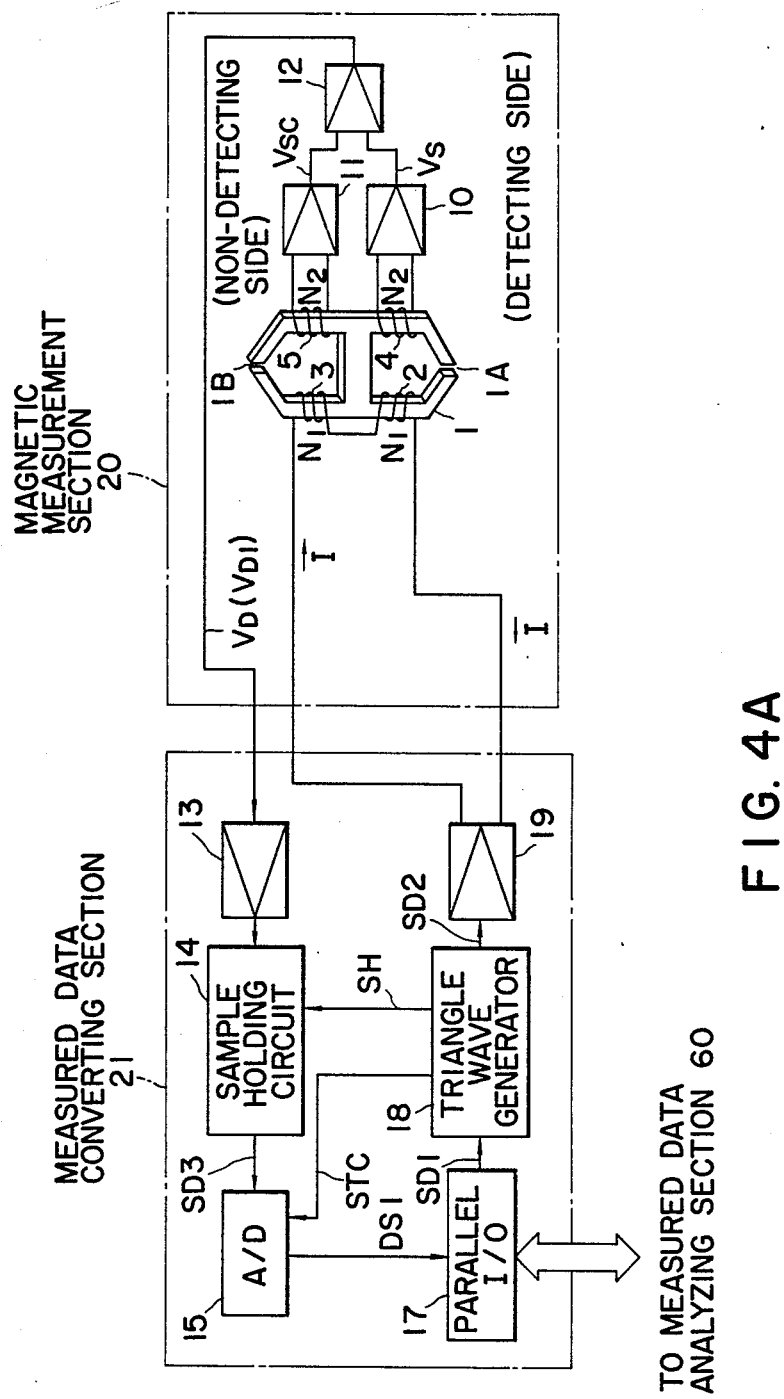
FIGS. 4A and 4B are block diagrams to show the circuit structures of the embodiment.
Figure 4B:
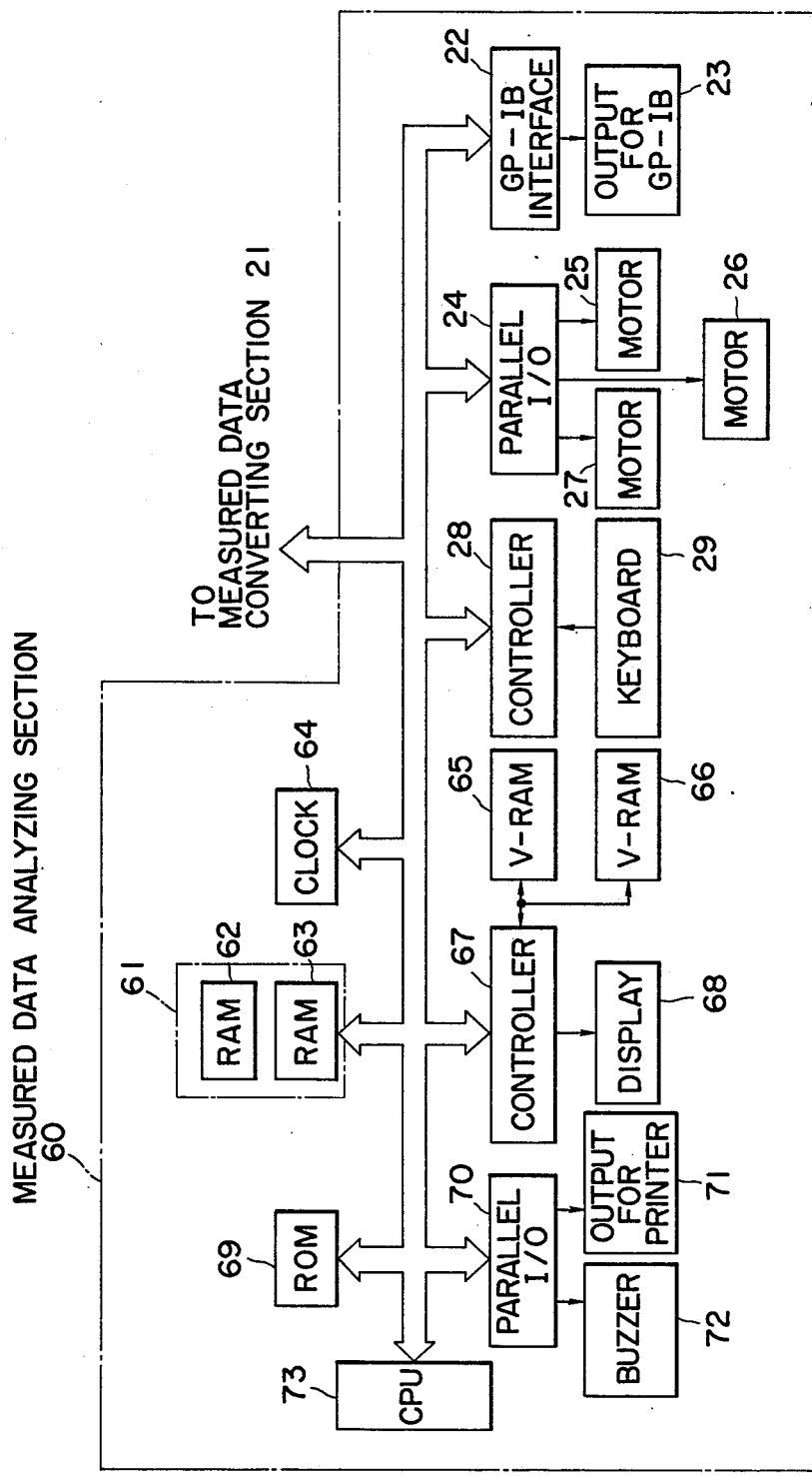

FIGS. 4A and 4B are block diagrams of the circuit of the measuring device 80 comprising a magnetic measurement section 20 which measures magnetization characteristics of a magnetic thin film of a magnetic card, a measured data converting section 21 which converts a voltage signal $V_D$ of the value measured by the magnetic measurement section 20 into a digital signal and which generates a triangle wave signal SD2 for driving the magnetic measurement section 20, and a measured data analyzing section 60 which processes the digital signal converted by the measured data converting section 21 with a computer to display magnetic characteristics and which functions to discriminate the magnetization characteristics and to run selfdiagnois.

Each component section will now be described in more detail.

The magnetic measurement section 20 is provided with a magnetic head 1 which is formed symmetrically both vertically and horizontally in the shape of a letter H. The magnetic core of the magnetic head 1 is wound with primary coils 2 and 3 which are connected in series each having a winding number $N_1$. The magnetic core is also connected with secondary coils 4 and 5 each having a winding number $N_2$. The primary coils 2 and 3 are supplied with a triangle wave signal SD2, being of a low frequency from 1 to 10 Hz, by the measured data converting section 21 via an amplifier 19. The magnetic core 1 is provided with a gap 1A at the detecting side on the lower part thereof and with a gap 1B for the nondetecting side on the upper part thereof. The output voltage $V_s$ of the secondary coil 4 is obtained from an amplifier 10 while the output voltage $V_{sc}$ of the secondary coil 5 is obtained from an amplifier 11. Both the output voltage $V_s$ and $V_{sc}$ are inputted to a differential amplifier 12. The gains of the amplifiers 10 and 11 and the differential amplifier 12 are assumed to be "1" for convenience's sake.

The measurement principle of the magnetic head 1 will now be described. The cross sectional area of the magnetic core 1 at the coils is denoted as S, and at the gap 1A as $S_g$, the length of the core magnetic path as l, the gap length as $l_g$, the permeability of the magnetic core 1 as $\mu$, and the permeability of air as $\mu_o$.

The magnetic field generated on the gap 1A on the detecting side will be described first.

The magnetic flux $\Phi$ when no medium is contacted with the gap 1A is represented by the equation below wherein the magnetic reluctance of the magnetic core 1 is denoted as R ($=l/\mu S$), and the magnetic reluctance of the gap 1A as Rg ($=l_g/\mu_o S_g$).

$$\Phi = \frac{N_1 I}{R + R_g} = \frac{N_1 I}{\frac{l}{\mu S} + \frac{l_g}{\mu_o S_g}} \quad (4)$$

The magnetic field $H_g$ of the gap 1A is represented as below.

$$H_g = \frac{\Phi}{\mu_o S_g} = \frac{N_1 I}{\frac{\mu_o S_g}{\mu S} l + l_g} \quad (5)$$

If $(\mu_o S_g/\mu_s)l << l_g$, then the following relationship holds as shown in equation (6).

$$H_g \doteq \frac{N_1 I}{l_g} \quad (6)$$

Figure 1:
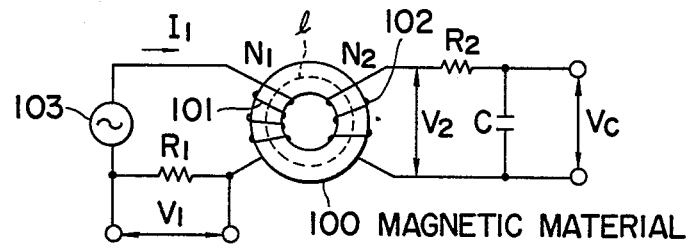
FIG. 1 is an explanatory view of a typical detection method of magnetization characteristics in the prior art.
Figure 2:
FIG. 2 is a view of the state of a magnetic tape.
Figure 5:
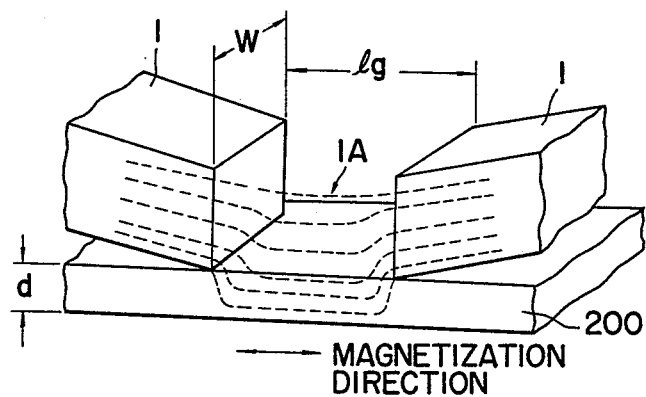
FIG. 5 is a view of the state of magnetic flux at a gap portion on a magnetic head.

Due to the relation of R << $R_g$, the magnetic flux $\Phi$ at the gap 1A shows an extension as shown if FIG. 5 and a portion of the magnetic flux extends in parallel to the direction to the length of apparent gap $l_g$ in the magnetic thin film 200. If the magnetic thin film 200 is in contact with the gap 1A, and the magnetic flux at the time is denoted as $\Phi_1$, the electromotive voltage $V_s$ of the secondary coil 4 can be expressed by the equations (7) and (8) belows.

$$V_s = -N_2 \frac{d\Phi}{dt} \text{ (absence of medium)} \quad (7)$$

$$V_{S1} = -N_2 \frac{d\Phi_1}{dt} \text{ (presence of medium)} \quad (8)$$

If the magnetic flux is denoted as $\Phi_c$, the electromotive voltage $V_{sc}$ of the secondary coil 5 on the non-detecting side is expressed as below.

$$V_{sc} = -N_2 \frac{d\Phi_c}{dt} \quad (9)$$

Therefore, the output $V_D$ after differential by the differential amplifier 12 becomes as below when there is no magnetic thin film 200 present according to the equations (7) through (9).

$$V_D = V_S - V_{SC} = -N_2 \left( \frac{d\Phi}{dt} - \frac{d\Phi_c}{dt} \right) \quad (10)$$
$$= -N_2 \frac{d(\Phi - \Phi_c)}{dt}$$

It is expressed as below when the magnetic thin film 200 is present.

$$V_{D1} = V_{S1} - V_{SC} = -N_2 \left( \frac{d\Phi_1}{dt} - \frac{d\Phi_c}{dt} \right) \quad (11)$$
$$= -N_2 \frac{d(\Phi_1 - \Phi_c)}{dt}$$

Since the low frequency triangle wave signal is applied on the primary coils 2 and 3 from the measured data converting section 21, the magnetic flux $\Phi$ decreases or increases simply. The output $V_D$ or $V_{D1}$ of the differential amplifier 12 is converted by the measured data converting section 21 and is taken into the measured data analyzing section 60 and then is stored in RAMs 62 and 63 in a memory section 61. The stored data is read out in synchronism with a charged magnetic field H from the RAMs 62 and 63 and is capable of computing the difference between the equation (10) and the equation (11), the voltage $V_D'$ based on an increment of the magnetic flux $\Phi$ due to the presence of the magnetic thin film 200 can be calculated. There is no need to take in the differential output $V_D$ into a computer but simply $V_{D1}$ is regarded as $V_D'$ when the output from the differential amplifier 12 is substantially approximate to zero when there is not magnetic thin film 200 to allow a rough detection, and when the output $V_D$ becomes zero (by making the characteristics on the cancellation side and the detecting side completely agree to each other or $V_s = V_{sc}$) by enhancing the manufacture precision of the magnetic core 1.

$$V_D' = V_{D1} - V_D = -N_2 \left( \frac{d\Phi_1}{dt} - \frac{d\Phi}{dt} \right) \quad (12)$$
$$= -N_2 \frac{d(\Phi_1 - \Phi)}{dt}$$

If the cross sectional area of the magnetic thin film 200 is denoted as $S_1$ ($=$thickness $t \times$ width W), the magnetic flux density $B_1$ is expressed as equation (13).

$$\Phi_1 - \Phi = \Phi' = B_1 \cdot S_1 \quad (13)$$

The equation (14) is derived from the equation (12).

$$V_D' = -N_2 \frac{d(B_1 S_1)}{dt} = -N_2 S_1 \frac{dB_1}{dH} \cdot \frac{dH}{dt} \quad (14)$$

The permeability $\mu_1$ of the magnetic thin film 200 can be represented by the equation (15). (More precisely, the magnetic susceptibility $\chi$, $\mu_1 = \chi = \mu_1' - 1$. The letter $\mu_1'$ denotes a true permeability).

$$\mu_1 = \frac{dB_1}{dH} = \frac{V_D'}{-NS_1 \cdot \frac{dH}{dt}} \quad (15)$$

By adding the data at each magnetic field intensity in equation 12), a software integration can be conducted. Namely, $$\Sigma(V_D' \cdot \Delta t) = -N_2 \int \frac{d\Phi'}{dt} \cdot dt = -N_2 \cdot \Phi' \quad (16)$$

holds. And therefore, equation (17) is derived as shown below $$\Phi' = \frac{-\Delta t}{N_2} \cdot \Sigma V_D' \quad (17)$$

Wherein $\Delta t$ denotes a sampling period, and the addition is conducted for one period of the charged magnetic field H.

The above software integration will now be described in detail. The characteristic curve I in the graph in FIG. 6 represents the change v(H) of the voltage $V_D'$ against magnetic field H in the equation (12), and an arbitrary point on the characteristic I is expressed as $v_i$. The following integrated values $\psi$ will be obtained next by means of the data sampling period $\Delta H$ from the initial value $v_i$.

$$\left.\begin{array}{rl} \psi_i & = V_i \cdot \Delta H \\ \psi_{i+1} & = \psi_i + V_{i+1} \cdot \Delta H \\ \psi_{i+2} & = \psi_{i+1} + V_{i+2} \cdot \Delta H \\ & \vdots \\ \psi_{i+n} & = \psi_{i+n-1} + V_{irn} \cdot \Delta H \\ & = \sum_{k=0}^{n} v_{i+K} \cdot \Delta H \end{array}\right\} \quad (18)$$

Accordingly, the value $\psi_{i+n}$ corresponding to the magnetic flux $\Phi_{i+1}$ becomes an integrated value in relation to the horizontal axis H (magnetic field). This characteristic is represented by the characteristic curve II in FIG. 6. In other words, the characteristic curve II is obtained by integrating the characteristic I in FIG. 6 from $v_i$. By correction, the magnetic flux $\Phi'$ can be calculated as follows.

$$\Phi' = \Phi_{(H)} = \frac{-1}{N_2}\left(\Delta H \cdot \sum_{k=0}^{n} V_{i+k} - \frac{1}{2}(\psi_i + \psi_{i+a})\right) \quad (19)$$

The $\psi_i$ and $\psi_{i+a}$ are assumed to be symmetrical to the center of gravity of the magnetization curves. The value $\psi_i$ is not necessarily an initial value of integration, but it may be any values so far as it is symmetrical to the center of gravity. The letter n denotes an integer counted in every sampling period $\Delta H$ from the initial value i.

With the magnetic field H and the magnetic flux $\Phi'$ thus obtained, the curve is drawn as shown in FIG. 7 which is the characteristic II shifted in the downward direction of the vertical axis.

The measured data converting section 21 shown in FIG. 4A will now be described.

The measured data converting section 21 is provided with a parallel input/output interface 17 for exchanging data with the measured data analyzing section 60. The controlling signals from the interface 17 are inputted to a triangle wave generator 18 to generate the triangle wave signal SD2 which is inputted to the magnetic measurement section 20 via the amplifier 19. A sample holding circuit 14 is provided to receive the input voltage $V_{D1}$ (when a magnetic thin film is present) and the input voltage $V_D$ (when no magnetic thin film is present) from the magnetic measurement section 20, each of the voltage having been amplified by an amplifier 13. The sample holding circuit 14 samples either the voltage $V_{D1}$ or $V_D$ with a timing signal SH from the triangle wave generator 18 and inputs sampled data SD3 to an A/D converter 15. The A/D converter 15 converts the sampled data SD3 into the digital signal DS1 with the timing signal STC from the triangle wave generator 18, and transmits the same to the measured data analyzing section 60 via the parallel input/output interface 17.

Figure 8:
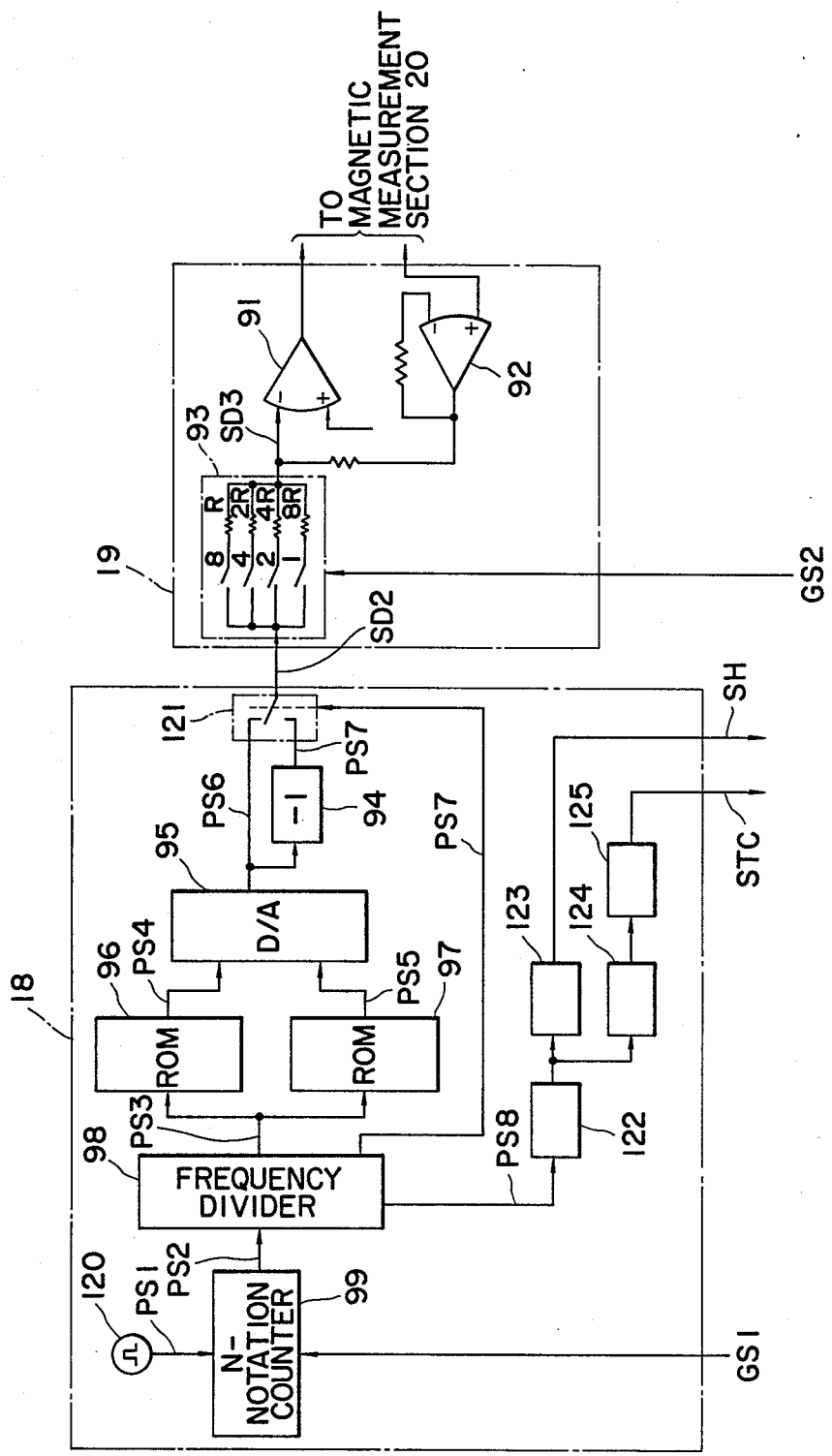
FIG. 8 is a detailed circuit diagram of a triangle wave generator.

A description will now be given of the method of generating the triangle wave signal SD2 in the measured data converting section 21. FIG. 8 shows in detail the triangle wave generator 18 and the amplifier 19. In the generator 18 are included a clock oscillator 120 which generates clock signals PS1, an N-notation counter 99 which counts the clock signals PS2 based on the set value N of the magnetization set signal GS1 and output pulse signals PS2, a frequency divider 98 which counts pulse signals PS2 and outputs the divided value PS3, and an ROM 96 (upper order bits) and an ROM 97 (lower order bits) which stores in advance voltage values (amplitude values) PS4 and PS5 for forming triangle waveforms based on the divided values PS3. Furthermore, the triangle wave generator 18 includes a D/A converter 95 which converts the output voltages PS4 and PS5 into triangle wave signal PS5 in analog signals, a converter 94 which inverts the polarity of the triangle wave signal PS6 to generate a triangle wave signal PS7, and a switch 121 which switches the triangle wave signals PS6 and PS7 based on the timing signal PS7 from the frequency divider 98 and outputs a triangle wave signal SD2. Further, one-shot circuits (monostable multivibrators) 122 through 125 are provided to convert the waveforms of the timing signals PS8 from the frequency divider 98 and to generate timing signals STC and SH.

Within the amplifier 19 are provided an amplitude controller 93 comprising resistance R through 8R which vary the amplitude of the triangle wave signal SD2 with the magnetizing for setting signals GS2 and outputs the triangle wave signal SD3, and amplifiers 91 and 92 which amplify the triangle wave signal SD3 and supply the same to a magnetic measurement section 20. The intesity of the magnetizing force is made proportional to the period of generated triangle waves. For instance, if the period of the triangle wave is 1.024 [s] with the magnetizing force of 10,000 [$0_e$], when the magnetizing force is set at 1,000 [$_e$], the period of the triangle wave is adapted to be 0.1024 [s]. This is because $d\Phi/dt$ should be constant.

Figure 9A:
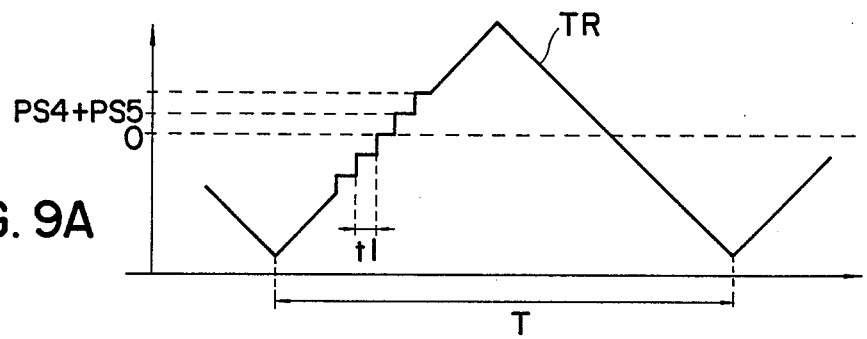
FIGS. 9A through 9C are views describing the method for generating the triangle wave signal.
Figure 9B:
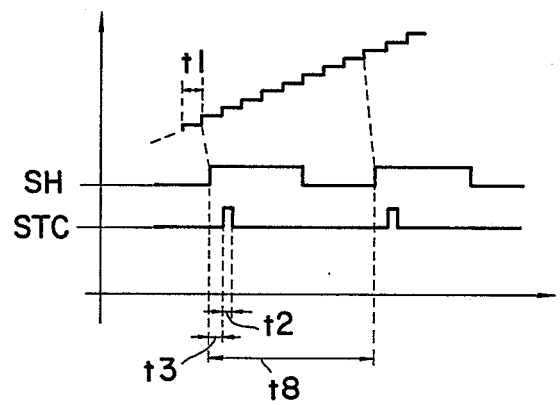
Figure 9C:
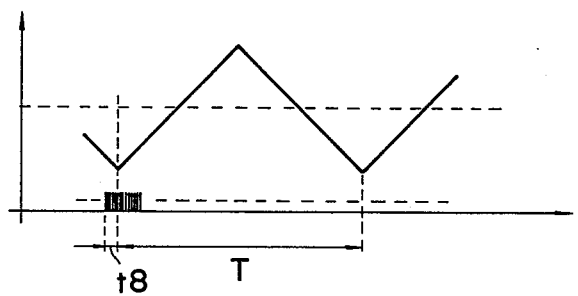

In such a structure as mentioned above, as shown in FIG. 9A, the triangle wave generator 18 stores voltage values PS4 and PS5 (the values PS4 and PS5 are combined to form a single voltage value) in the ROMs 96 and 97 for each sampled value using the waveform for one period of the triangle wave signal TR generated within the time T. (As the negative values are switched by the switch 121, the ROMs 96 and 97 store one half of the number of "4096"). The pulse $t_i$ is T/8192 here. The width of the pulse $t_1$ is identical with the period of the pulse signal PS2. The voltage values are read out from the ROMs 96 and 97 in correspondence to the counted values of the pulse signals PS2, and stepwise waveforms are generated as shown in the graphs, which are converted into analogue triangle wave signals SD2 by the D/A converter 95 and the converter 94, and outputted from the amplifier 19. FIG. 7B shows the relationship between the pulse width $t_1$ and the timing signals SH and STC wherein one timing signal SH and one timing signal STC are obtained with the pulse signal PS8 which is obtained each for every "8" pulse signals PS2 divided by the frequency divider 98. Between the timing signals SH the timing signal STC is produced a time difference $t_3$. More particularly, as shown in FIG. 9C, the timing signals SH and STC are obtained in every time $t_8$ to convert the voltage $V_{D1}$ or $V_D$ from the magnetic measurement section 20 into digital signals. The amplifier 19 is feedback controlled so as to have a constant current, and the amplitude of its output triangle wave current I may be known from the set resistance at the amplitude controller 93 in the amplifier 19. The number of sampled signals by the A/D converter 15 (FIG. 4) is fixed at (8192/8)=1024, for instance, as is obvious from the description above. The CPU corresponds the value I of exciting current at the time with voltages $V_{D1}$ and $V_D$ from the amplitude of the exciting triangle wave and the sequence of the data converted by the A/D converter 15.

The measured data analyzing section 60 will now be described.

The analyzing section 60 comprises a CPU 73 which controls respective sections, and reads out the data from the RAMs 62 and 63 in the memory section 61 for operation (software intergration), an ROM 69 which stores control programs, and a memory section 61 having an RAM 62 for storing differential output voltage data of the magnetic head 1 when a magnetic thin film 200 is present under the magnetic head 1 and an RAM 63 for storing the differential output voltage data of the magnetic head 1 when the magnetic thin film 200 is not present thereunder. The CPU further comprises a clock circuit 64 which displays the date and time on a display 68 such as a liquid crystal device, a GP-IB interface 22, and parallel I/O (input/output) interfaces 24 and 70. The GP-IB interface 22 is connected with a GP-IB output connector 23. The parallel I/O interface 24 is connected to a motor 26 which moves the marker 83, a motor 27 which moves the arm 81 and a motor 25 which moves the magnetic head 1. The parallel I/O interface 70 is connected to a buzzer 72 which issues an alarm sound on acceptance/rejection of the magnetization characteristics and an output connector 71 for a printer which outputs the magnetization characteristics for printing by a printer. The CPU further includes a controller 67 for driving the display 68 and a key controller 28 for controlling the data input from the keyboard 29. The controller 67 is connected to the RAMs 65 and 66 which store images equivalents two screen frames.

Operation of the measurement system is described below referring to the flow chart in FIG. 10.

Figure 11:
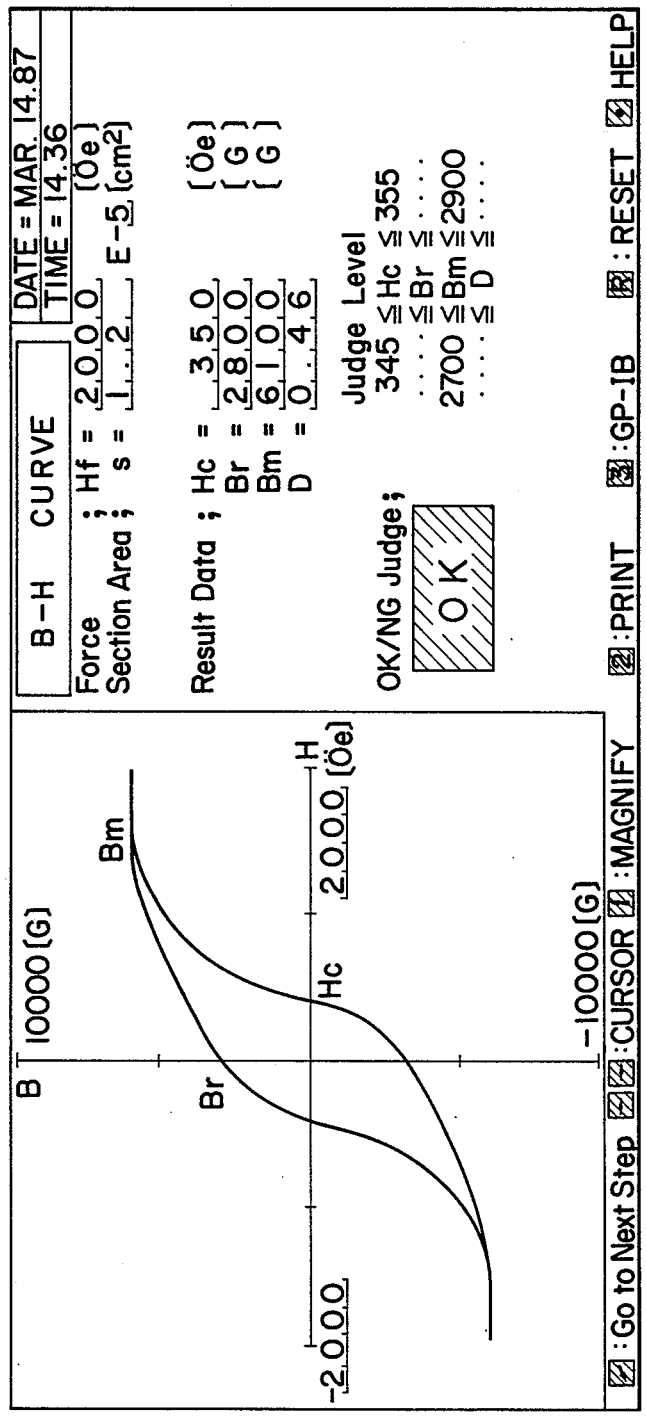
FIGS. 11 through 13 show graphs displayed on a display.

The power source switch 84 of the measuring device 80 is turned on, and the acceptance range of the magnetization characteristics of the magnetic thin film 200 which is the object of measurement and the range of magnetization force (e.g. 1000 [$O_e$]~10,000 [$O_e$] in ten steps) are inputted with using the ten-keys on the keyboard 29 (Step S1). This inputted data within the accep-
tance range are stored in the memory section 61 of the measured data analyzing section 60. The acceptance scope data comprises upper and lower limits of the saturated magnetic flux $\Phi_m$ (saturated magnetic flux density $B_m$), residual magnetic flux $\Phi r$ (residual magnetic flux density $B_r$), coercive force $H_c$, and rectangular ratio D ($=\Phi_r/\Phi_m=B_r/B_m$). Modes are selected from the keyboard 29 (Step S2). When a measurement mode is selected, the target magnetic card or the like is inserted in a table 82 of the measuring device 80, and the target portion of the magnetic thin film 200 is positioned on the marker 83 (Step S3). Then, the motor 27 is driven by operating the keyboard 29 to thereby make the arm 81 go down in the direction N. The set magnetic card and so on are slightly pushed and fixed therein. Thereafter, the position of the magnetic thin film 200 which should be measured is confirmed as not deviating, and then the key is manipulated. The motor 26 is driven in accordance with the key operation, the marker 83 is moved in the direction M and is then received within the measuring device 80. The magnetic head 1 is positioned on the magnetic thin film 200 of the magnetic card and so on by driving the motor 25, and when control signals are sent from the measured data analyzing section 60 to the converting section 21, the measurement of the magnetization characteristics is started (Step S4). The triangle wave signal SD2 outputted from the triangle wave generator 18 is applied on the primary coils 2 and 3 of the magnetic head 1 of the magnetic measurement section 20 via the amplifier 19 to generate the magnetic field H between the gap 1A and the gap 1B of the magnetic head 1. The secondary coils 4 and 5 generate the electric voltages in proportion to the chronological changes in magnetic flux passing through the magnetic core 1, and voltage signal $V_{D1}$ is obtained via the amplifiers 10, 11 and the differential amplifier 12, and the voltage $V_{D1}$ is inputted to the sample holding circuit 14 in the converting section 20. The sampling data SD3 is converted into digital signals DS1 by the A/D converter 15 and inputted to the measured data analyzing section 60 via the parallel input/output interface 17. When the voltage signal $V_{D1}$ is stored in the RAM 62 for every predetermined time $t_8$ for one period of the triangle wave signal, the magnetic head 1 is removed from the magnetic thin film 200 by driving the motor 25. In a similar manner, the voltage signal $V_D$ is stored in the RAM 63 for every predetermined time $t_8$ for one period of the traingle wave signal. Then, signals corresponding to the RAMs 62 and 63 are subtracted. The hysteresis curve and the magnetization characteristics $\Phi_r$ ($B_r$), $\Phi_m$ ($B_m$), $H_c$ and D are stored in the memory section 61 as measured values (Step S5). The CPU 73 compares the above measured values with pre-set reference values indicating the scope of acceptance, and displays on the display 68 the result using such terms as "OK" or "NG" as well as the measured data, the hysteresis curve and so on as shown in FIG. 11. The distribution characteristics are displayed on the display 68 as shown in FIG. 11 based on the measurement results and stored in the video RAMs 65 and 66 via the controller 67. The buzzer 72 is actuated via the parallel input/output interface 70 and when it is displayed "OK", the buzzer 72 issues continuous BEEP sound (Steps S6 and S7). When it is displayed "NG" on the display 68, it issues an intermittent sound like Bip, Bip, ... (Steps S6 and S8). By executing the aforementioned processes, the magnetic characteristics are stored in the memory 61 (Step S9). The memory 61 has a capacity for one hundred data with in the RAM, and data are chronologically and successively logged together with the measurement time data from the clock circuit 64 therein. Moreover, the marker 83 is initialized positionwise at the same time as the magnetic head 1 moves away from the magnetic thin film 200. The arm 81 starts recording back upward after the voltage signal $V_D$ has been sampled.

When the mode switching is not designated by the key input, the measurement device should wait for the next measurement. After measurement of several magnetic cards, and the data processing mode I is selected by the key input (Steps S10 and S2), the CPU 73 calculates the logging data in the memory section 61, and displays the x-R control diagram of the particular magnetization characteristics (for instance, $\Phi_r$ at the locations measured by the magnetic head 1) selected as FIGS. 12A and 12B on the display 68. The x-R control diagram is prepared as follows. The total number N of data, size n of the groups and number k of the groups are determined as prerequisites. The total number N is determined by automatically counting the data in the memory 61, the size n is determined according to the input by the user (n=3, 4 or 5), the number k is the quantity obtained by $k=N/n$, and the resultant fraction is not used. For instance, if N=98 and n=3, the number k becomes "32" and the data after the 97th data are not used. The average $\bar{x}$ of a group can be obtained by the equation (20).

$$\bar{x}_j = \frac{1}{n} \sum_{i=1}^{n} X_i \quad (20)$$

The grand average $\bar{\bar{x}}$ of the average $\bar{x}$ for respective groups is obtained by the equation (21).

$$\bar{\bar{x}} = \frac{1}{k} \sum_{j=1}^{k} \bar{x}_j \quad (21)$$

The upper and lower critical lines UCL and LCL are expressed as below.

$$UCL = \bar{\bar{x}} + A_2 \bar{R} \quad (22)$$

$$LCL = \bar{\bar{x}} - A_2 \bar{R} \quad (23)$$

Where, $A_2$ and $D_4$ are obtained from the table 1.

TABLE 1

| n | $A_2$ | $D_4$ |
|---|-------|-------|
| 3 | 1.02  | 2.58  |
| 4 | 0.729 | 2.28  |
| 5 | 0.577 | 2.12  |

Figure 12A:
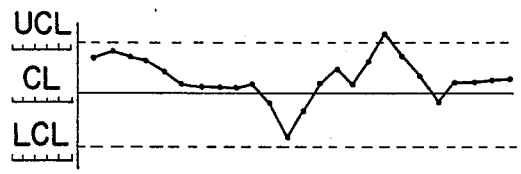

If these data are plotted in a graph, a graph results as that shown in FIG. 12A wherein the horizontal axis calibrates the number of groups. If n=3, and the axis calibrates by "5" until "33", when n=4 and n=5, the calibration will be set by "5" until "25". The vertical axis displays x wherein a limited number of dots are fixed for the length between LCL and UCL and numerical values denote LCL, CL and UCL. The fluctuation R in a group can be determined by the equation (24).

$$R_j = X_{max} - X_{min} \quad (24)$$

The grand average $\bar{R}$ of the fluctuations R of all the groups can be determined by the equation (25).

$$\bar{R} = \frac{1}{k} \sum_{j=1}^{k} R_j \quad (25)$$

The upper and lower control critical line UCL is determined by the equation (26).

$$UCL = D_4 \bar{R} \quad (26)$$

Figure 12B:
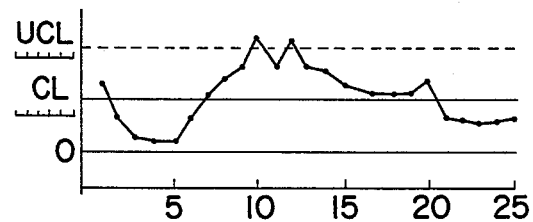

The coefficient $D_4$ is obtained from the table 1. FIG. 12B shows the graph of aforementioned data.

When a data processing mode II is selected by the key input (Step S2), the CPU 73 calculates the logging data in the memory section 61 (Step S13) and displays the particular histogram of the selected magnetization characteristics on the display 68 (e.g. $\Phi_r$) (Step S14). As a prerequisite, the maximum class number should be set at "10" on the horizontal axis and the ranges on the vertical axis should be automatically set at three values of "80", "40" and "20". Moreover, the calibration on the horizontal axis should display the values of $X_{max}$ and $X_{min}$. The number of the class k for the classification is set as shown in equation (27).

$$k \doteq \sqrt{N} \quad (27)$$

The step width $H_m$, average $\bar{x}$ and standard deviation $\sigma$ are calculated according equations (28), (29) and (30).

$$H_M = \frac{X_{man} - X_{min}}{k} \quad (28)$$

$$\bar{x} = \frac{1}{N} \sum_{i=1}^{N} X_i \quad (29)$$

$$\sigma = \sqrt{\frac{1}{N} \sum_{i=1}^{N} (x_i - \bar{x})^2} \quad (30)$$

Figure 13:
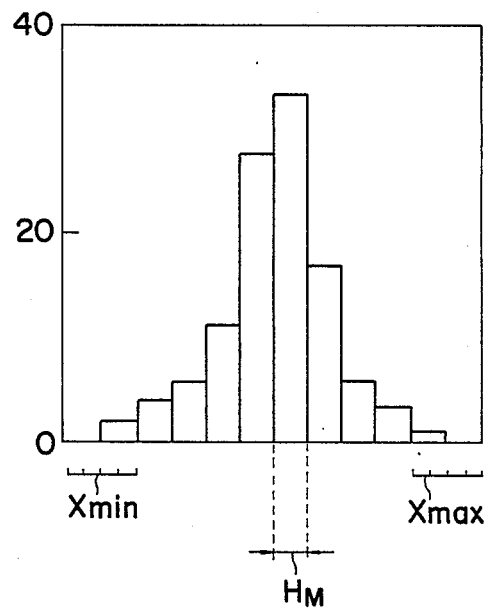

When data are substituted in the aforementioned equations (27) through (30) and plotted, the graph shown in FIG. 13 is obtained. However, the number of data N is determined by automatically counting the data stored in the memory section 61, and the maximum number is set at "100".

The measured data analyzing section 60 is equipped with such self diagnosing functions as display checking, buzzer checking, motor checking, ROM and RAM checking, printer checking, etc. and can be maintained by input commands from the keyboard.

Figure 16:
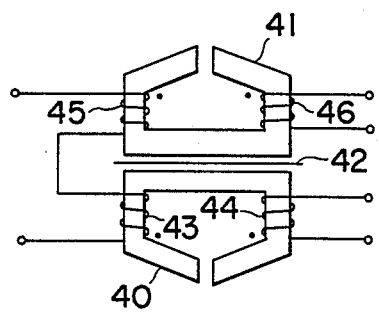
Figure 17:
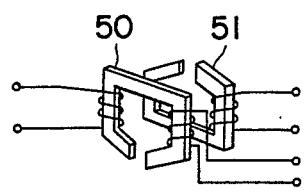
Figure 18:
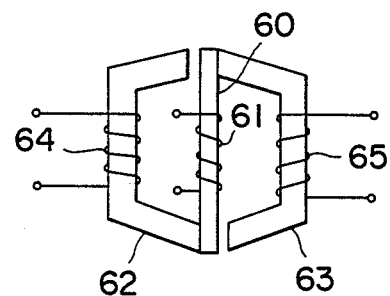

The winding of the primary and secondary coils on the magnetic core is by no means limited to those shown in FIG. 4, but may be of a structure wherein a magnetic core 1 of FIG. 4 is bent at the center of the vertical axis or of the horizontal axis or of the structure shown in FIG. 14 wherein the primary coil 30 is wound on a connection arm 1C the magnetic core 1. As shown in FIG. 15, both arms of the magnetic core 1 may moreover be wound not only with the primary coils 31 through 34 in serial but also with the secondary coil upon the primary coils 31 and 34. Alternatively, the magnetic core may be divided into cores 40 and 41, shielded from each other with a shield material 42 as shown in FIG. 16. The magnetic core 40 may be wound with the primary coil 43 and the secondary coil 44 while the magnetic core 41 is wound with the primary coil 45 and the secondary coil 46. As shown in FIG. 17, the magnetic cores 50 and 51 may be completely divided, and wound with the primary and secondary coils respectively. The primary coil 61 may be wound on a plate type magnetic core 60 and the secondary coils 64 and 65 may be wound on letter U type magnetic cores 62 and 63 which are connected to both sides of the magnetic core 60 as shown in FIG. 18. Although the low frequency triangle wave signal is applied on the primary coil in the above examples, it may be a sine wave signal. Integration of differential output voltage $V_{DL}$ may be made by an integration circuit of C.R instead of the above mentioned integration with software. If the differential output voltage $V_D$ without the magnetic thin film 200 cannot be ignored, the precision may be improved by taking the integrated value of the differential output voltage $V_{DL}$ with the magnetic thin film 200 and the integrated value of the differential output voltage $V_D$ without the magnetic thin film 200 within a computer, synchronizing by an applied magnetic field, and obtaining the difference therebetween. Although the magnetic head 1 and the marker 83 are moved by separating motors in the above description, the movement may be carried out by a single motor in an interlocked manner. The mechanism for moving the magnetic head 1 may be by any known mechanism.

As described in the foregoing statement, this invention magnetization characteristic measuring device can measure magnetization characteristics of a magnetic thin film simply by placing the magnetic thin film portion of magnetic printing, magnetic tape, magnetic disc, magnetic card and so on. Since it can display and notify acceptance/rejection of the magnetizing characteristics using the screen of the display or using a buzzer, this invention device can spare an ispection step. Further, as the quality level is displayed referring to a reference set in advance, standardization of quality becomes easy. As this invention device incorporates clock functions, the measured data can be maintained, operated, analyzed and printed in closer correspondence to time data to thereby simplify data processing. The device becomes smaller in size than the prior art device, and further as it is integrating in structure, it is easier to transport. The operability is also improved as its operation can be guided from the display screen. Since it also functions to effect self-diagnosis, maintenance is also improved.

It should be understood that many modifications and adaptations of the present invention will become apparent to those skilled in the art and it is intended that such obvious modifications and changes be encompassed in the scope of the claims appended hereto.

What is claimed is:

1. A device for measuring magnetization characteristics of a magnetic thin film comprising: a differential magnetic head; a triangle wave signal generator for exciting said differential magnetic head with a triangle wave signal; a magnetic head moving means for positioning said differential magnetic head to a position closely adjacent to the magnetic thin film; a measured data converting means for sampling differential output voltages from said differential magnetic head when said differential magnetic head is positioned closely adjacent to the magnetic thin film and for converting the thus sampled output voltage values into respective digital values; and a measured data analyzing means for sequentially storing said digital values converted by said converting means and for calculating magnetization characteristics of the magnetic thin film.

2. A magnetization characteristic measurement device as claimed in claim 1 wherein the frequency of said low frequency triangle wave signal is in the range of 1–10 Hz.

3. A magnetization characteristic measurement device as claimed in claim 1, wherein said measured data analyzing means includes a means for determining differential output voltages $V_D$ and $V_{D1}$, said differential output voltage $V_D$ being a differential output voltage when the magnetic thin film is closely adjacent to said differential magentic head and said differential output voltage $V_{D1}$ being a differential output voltage when the magnetic thin film is not closely adjacent to said differential magnetic head, a means for calculating a difference voltage $V_{D'}$ by subtracting the voltage $V_D$ from the voltage $V_{D1}$, and a means for calculating, a magnetic flux $\Phi'$ by using the following equation:

$$\Phi' = \frac{-\Delta t}{N_2} \cdot \Sigma V_{D'}$$

wherein $\Delta t$ denotes a sampling period, and $N_2$ is a winding number of a secondary coil wound on said differential magnetic head.

4. A magnetization characteristic measurement device as claimed in claim 3, further comprising a means for displaying a magnetization curve depicting a relationship between a charged magnetic field H and said magnetic flux $\Phi'$.

5. A device for measuring magnetization characteristics of a magnetic thin film comprising: a differential magnetic head; a triangle wave signal generator for exciting said differential magnetic head with a triangle wave signal; a magnetic head moving means for positioning said differential magnetic head to a position closely adjacent to the magnetic thin film; a setting means for setting in advance a maximum acceptable value and a minimum acceptable value of the magnetization characteristics of the magnetic thin film; a measured data converting means for sampling differential output voltages from said differential magnetic head when said differential magnetic head is positioned closely adjacent to the magnetic thin film, and for converting the thus sampled differential output voltage values into respective digital values; and a measured data analyzing means for sequentially storing said digital values converted by said measured data converting means, and for calculating the magnetization characteristics of the magnetic thin film, and for comparing the thus calculated magnetization characteristics with said maximum acceptable value and minimum acceptable value set in advance by said setting means to thereby determine the acceptability of the magnetic thin film.

6. A magnetization characteristic measurement device as claimed in claim 5, wherein said differential magnetic head comprises a magnetic core which is configured in a shape of a letter H having two vertical side arms and one horizontal connecting arm and which is horizontally and vertically symmetrical.

7. A magnetization characteristic measurement device as claimed in claim 6, further comprising a plurality of primary coils wound in series on one vertical side arm of said magnetic core and a plurality of secondary coils separately wound on the other side arm thereof.

8. A magnetization characteristic measurement device as claimed in claim 6, further comprising a primary coil wound on said horizontal connection arm and a plurality of secondary coils separately wound on one of said vertical side arms.

9. A magnetization characteristic measurement device as claimed in claim 6, further comprising a plurality of primary coils wound in series on said two vertical side arms of said magnetic core and a plurality of secondary coils wound in layers on one of said vertical side arms.

10. A magnetization characteristic measurement device as claimed in claim 5, wherein said differential magnetic head comprises a magnetic core portion which is divided into two magnetic cores shielded from each other with a shielding material.

11. A magnetization characteristic measurement device as claimed in claim 5, wherein said measured data converting means includes said low frequency triangle wave generator and said triangle wave signal is outputted via an amplifier means.

12. A magnetization characteristic measurement device as claimed in claim 11, wherein said amplifier means comprises an amplitude controller comprising resistance trains to be switched by setting signals and amplifiers for amplifying a signal outputted from said amplitude controller.

13. A magnetization characteristic measurement device as claimed in claim 12, wherein relative resistance values of said resistance trains are R, $R^2$, $R^4$, ... $R^{2(n-1)}$, $R^{2n}$ and wherein one of said resistance trains is activated by said setting signals.

14. A magnetization characteristic measurement device as claimed in claim 12, wherein said low frequency triangle wave signal generator comprises a clock pulse oscillator which generates clock pulses, an N-notation counter which counts the clock pulses, a frequency divider which counts an output of said N-notation counter, ROMs which inputs divided signals by said frequency divider and output respective digital data for triangle wave generation and a D/A converter which converts outputs of the ROMs into an analog signal.

15. A magnetization characteristic measurement device as claimed in claim 14, wherein said analog signal is fed to said resistance trains via an inverter and an ON-OFF switch.

16. A magnetization characteristic measurement device as claimed in claim 5, wherein said measured data analyzing means includes a CPU which reads out data from a memory and operates a software integration, and a ROM which stores a control program.

17. A magnetization characteristic measurement device as claimed in claim 16, wherein said measured data analyzing means further includes a display means for displaying obtained magnetization characteristics.

* * * * *